(12) United States Patent
Choi et al.

(10) Patent No.: US 11,907,629 B2
(45) Date of Patent: Feb. 20, 2024

(54) COMPUTING SYSTEM AND METHOD OF VERIFYING CIRCUIT DESIGN IN COMPUTING SYSTEM

(71) Applicant: SAMSUNG ELECTRONICS CO., LTD., Suwon-si (KR)

(72) Inventors: Soonwoo Choi, Seoul (KR); Jung Woon Lee, Daejeon (KR); Junyoung Jeong, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 29 days.

(21) Appl. No.: 17/552,819

(22) Filed: Dec. 16, 2021

(65) Prior Publication Data

US 2022/0237351 A1  Jul. 28, 2022

(30) Foreign Application Priority Data

Jan. 22, 2021 (KR) .................. 10-2021-0009592
May 20, 2021 (KR) .................. 10-2021-0064979

(51) Int. Cl.
*G06F 30/33* (2020.01)
*G06F 30/323* (2020.01)
*G06F 30/333* (2020.01)

(52) U.S. Cl.
CPC ............ *G06F 30/33* (2020.01); *G06F 30/323* (2020.01); *G06F 30/333* (2020.01)

(58) Field of Classification Search
USPC ........................................... 716/106
See application file for complete search history.

(56) References Cited

U.S. PATENT DOCUMENTS

| | | |
|---|---|---|
| 6,212,667 B1 | 4/2001 | Geer et al. |
| 6,347,388 B1 | 2/2002 | Hollander |
| 6,415,396 B1 | 7/2002 | Singh et al. |
| 6,530,054 B2 | 3/2003 | Hollander |
| 7,278,056 B2 | 10/2007 | Hekmatpour |
| 7,281,185 B2 | 10/2007 | Maoz et al. |
| 7,711,992 B2 | 5/2010 | Coulter et al. |

(Continued)

OTHER PUBLICATIONS

Mehra N. Borazjany, et al., "Combinatorial Testing of Acts: A Case Study", 2012 IEEE Fifth International Conference on Software Testing, Verification and Validation, Apr. 17-21, 2012.

(Continued)

*Primary Examiner* — Bryce M Aisaka
(74) *Attorney, Agent, or Firm* — F. Chau & Associates, LLC (57) ABSTRACT

A computing system configured to verify design of an integrated circuit (IC) includes a memory and a processor. The memory is configured to store computer executable instructions. The processor is configured to generate a first coverage model for at least two high-level parameters from the Institute of Electrical and Electronics Engineers (IEEE) 802.11 standard or hardware description language (HDL) code by executing the computer executable instructions, generate a second coverage model for low-level internal signals from the HDL code by executing the computer executable instructions, and generate a plurality of test packets for a regression test by using at least one of the first coverage model or the second coverage model by executing the computer executable instructions.

10 Claims, 8 Drawing Sheets

(56) References Cited

U.S. PATENT DOCUMENTS

| | | | |
|---|---|---|---|
| 7,729,891 B2 | 6/2010 | Fine et al. | |
| 8,832,622 B1 * | 9/2014 | Xu | G06F 30/33 716/112 |
| 10,515,169 B1 | 12/2019 | Spatafore et al. | |
| 2011/0320993 A1 * | 12/2011 | Hsiong | G06F 11/263 716/106 |
| 2020/0242012 A1 | 7/2020 | Hicks et al. | |
| 2020/0394125 A1 | 12/2020 | Hicks et al. | |

OTHER PUBLICATIONS

Masanaro Kuwahara, "Design and verification methods of toshiba's wireless LAN baseband SoC", 2010 15th Asia and South Pacific Design Automation Conference (ASP-DAC).

Soonwoo Choi, et al., "Generation of efficient bitstreams for functional tests of video decoders", 2013 IEEE International Conference on Consumer Electronics (ICCE).

Evegny Khorov, et al., "A Tutorial on IEEE 802.1 1ax High Efficiency WLANs", IEEE Communications Surveys & Tutorials, vol. 21, No. 1, First Quarter 2019.

IEEE P802.11ax™M/D8.0 Draft Standard for Information technology—Telecommunications and information exchange between systems Local and metropolitan area networks—Specific requirements; IEEE 802.11ax™M/D8.0, Oct. 2020 [Prepared by the 802.11 Working Group of the LAN/Man Standards of the IEEE Computer Society].

* cited by examiner

COMPUTING SYSTEM AND METHOD OF VERIFYING CIRCUIT DESIGN IN COMPUTING SYSTEM

CROSS-REFERENCE TO RELATED APPLICATION

This application claims priority under 35 U.S.C. § 119 to Korean Patent Applications Nos. 10-2021-0009592 and 10-2021-0064979, respectively filed on Jan. 22, 2021 and May 20, 2021 in the Korean Intellectual Property Office, the disclosures of which are incorporated by reference herein in their entirety.

TECHNICAL FIELD

Embodiments of the inventive concept relate to a computing system and a method of verifying design of an integrated circuit (IC) when a wireless local area network (WLAN) is developed in the computing system.

DISCUSSION OF RELATED ART

As the complexity of integrated circuits (ICs) increases, an operation of verifying circuit design becomes difficult, and the time required to verify the circuit design increases. To reduce the time to market and increase the quality of circuit design, various modeling methodologies have been proposed to increase design productivity and simulation speed.

Various tests may be generally performed based on simulation to verify circuit design. To evaluate the completeness of verification, a measure called coverage may be used. Coverage may refer to a degree to which a test is performed. Types of coverage may include code coverage and function coverage. The function coverage may be obtained via a test using a constrained random method, which is a method of numerically indicating an extent to which a designed product performs all operations to be performed in a functional aspect, in accordance with the design specification.

SUMMARY

According to an embodiment of the inventive concept, a computing system configured to verify design of an integrated circuit (IC) includes a memory configured to store computer executable instructions and a processor configured to execute the computer executable instructions and generate a first coverage model for at least two high-level parameters from the Institute of Electrical and Electronics Engineers (IEEE) 802.11 standard or hardware description language (HDL) code. The processor executes the computer executable instructions and generates a second coverage model for low-level internal signals from the HDL code. The processor executes the computer executable instructions and generates a plurality of test packets for a regression test by using at least one of the first coverage model or the second coverage model.

According to an embodiment of the inventive concept, a method of verifying design of an IC includes selecting at least one parameter in a basic service set (BSS) at a predetermined bandwidth, generating a parameter set constituting a configuration from the at least one parameter by using an N-way covering algorithm (where N is a natural number), determining at least one of a length of a test packet or a channel model according to the configuration, generating a plurality of test packets for the configuration, and measuring a coverage of the plurality of test packets for a regression test.

According to an embodiment of the inventive concept, a computing system configured to verify design of a physical layer (PHY) receiver according to the IEEE 802.11 standard includes a memory configured to store computer executable instructions, and a processor configured to execute the computer executable instructions and generate a first coverage model for at least two high-level parameters from HDL code. The processor executes the computer executable instructions and generates a second coverage model for low-level internal signals from the HDL code. The processor executes the computer executable instructions and generates a plurality of test packets for a regression test by using at least one of the first coverage model or the second coverage model. The processor executes the computer executable instructions and verifies the design of the PHY receiver according to the plurality of test packets.

BRIEF DESCRIPTION OF THE DRAWINGS

The above and other features of the inventive concept will be more clearly understood by describing in detail embodiments thereof with reference to the accompanying drawings.

DETAILED DESCRIPTION OF THE EMBODIMENTS

Embodiments of the inventive concept provide a verification method, which may reduce a time for the design of an integrated circuit (IC) by efficiently performing test and verification during the development of a wireless local area network (WLAN).

Hereinafter, embodiments of the inventive concept will be described in detail with reference to the accompanying drawings. Like reference numerals may refer to like elements throughout this application.

Figure 1:
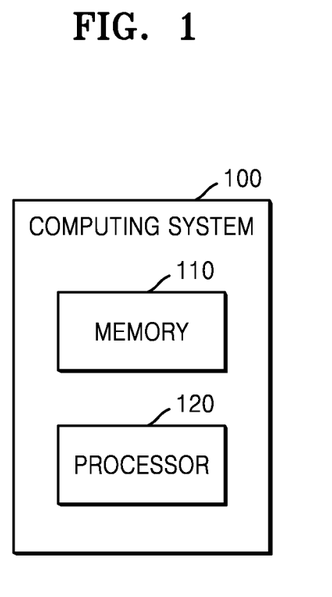
FIG. 1 is a block diagram of a computing system according to an embodiment of the inventive concept.

FIG. 1 is a block diagram of a computing system according to an embodiment of the inventive concept.

A computing system 100 according to an embodiment of the inventive concept may include a memory 110 and a processor 120. Referring to FIG. 1, in the computing system 100, only components related to the inventive concept are illustrated. Accordingly, it will be understood by one of ordinary skill in the art that the computing system 100 may further include other general-use components (e.g., an input/output (I/O) device or a bus) in addition to the components shown in FIG. 1. In an embodiment of the inventive concept, the computing system 100 for the design of an integrated circuit (IC) may be implemented as an integrated device and may be a computer configured to drive various simulation tools or design tools. The computing system 100 may include a stationary computing system, such as a desktop computer, a workstation, or a server, or a portable computing system, such as a laptop computer.

The memory 110 may be a volatile memory, such as static random access memory (SRAM) or dynamic RAM (DRAM), or a non-volatile memory, such as phase-change RAM (PRAM), resistive RAM (ReRAM), nano-floating gate memory (NFGM), polymer RAM (PoRAM), magnetic RAM (MRAM), ferroelectric RAM (FRAM), or flash memory. The memory 110 may store a program for processing and controlling the processor 120 and store computer executable instructions. For example, the computer executable instructions may be expressed as 32 bits, 64 bits, or other bits.

The processor 120 may execute the computer executable instructions stored in the memory 110 and generate a coverage model from hardware description language (HDL) code for circuit design. For example, the processor 120 may convert HDL code into a formal language model and automatically generate a function coverage model from the formal language model.

HDL may refer to a computer language for designing a structure and a function of an electronic circuit or a digital logic circuit, and may be, for example, Verilog or a very high speed integrated circuit (VHSIC) hardware description language (VHDL). In embodiments of the inventive concept, the HDL code may include register-transfer-level (RTL) code, gate-level code, or netlist code. In the following embodiments of the inventive concept, RTL code will be described as an example of the HDL code. However, it will be understood by one of ordinary skill in the art that other types of HDL code may also be applied to the following embodiments of the inventive concept.

The processor 120 may execute instructions to perform at least one of various operations for designing and verifying an IC. For example, the processor 120 may include a core (e.g., a micro-processor (MP), an application processor (AP), a digital signal processor (DSP), or a graphics processing unit (GPU)), which may execute an arbitrary instruction set (e.g., Intel Architecture-32 (IA-32), 64-bit extended IA-32, x86-64, PowerPC, SPARC, million instructions per second (MIPS), advanced reduced-instruction-set-computing (RISC) machine (ARM), IA-64, or the like). The processor 120 may communicate with the memory 110, an input/output (I/O) device, or a storage device through a bus.

According to an embodiment of the inventive concept, the processor 120 may verify a designed circuit by using a simulation method. As an example, the simulation method may include inputting the corresponding input data to a simulation tool to identify whether the circuit operates as designed once during each clock cycle and determining whether output data is output according to the design specification. Various simulation tools may be used to simulate the RTL code. Accordingly, there may be a problem in that it takes a relatively long time to monitor all signals described in the RTL code once during each clock cycle.

On the other hand, in a computing system and a method of verifying circuit design in the computing system, according to embodiments of the inventive concept, high coverage may be satisfied using a small number of test packets for a relatively short period of time, and thus, the time taken for the verification may be reduced. In addition, the time to develop products may be ultimately reduced by reducing the time for a regression time that is repeated during the development of a physical layer (PHY) of a wireless local area network (WLAN).

Figure 2A:
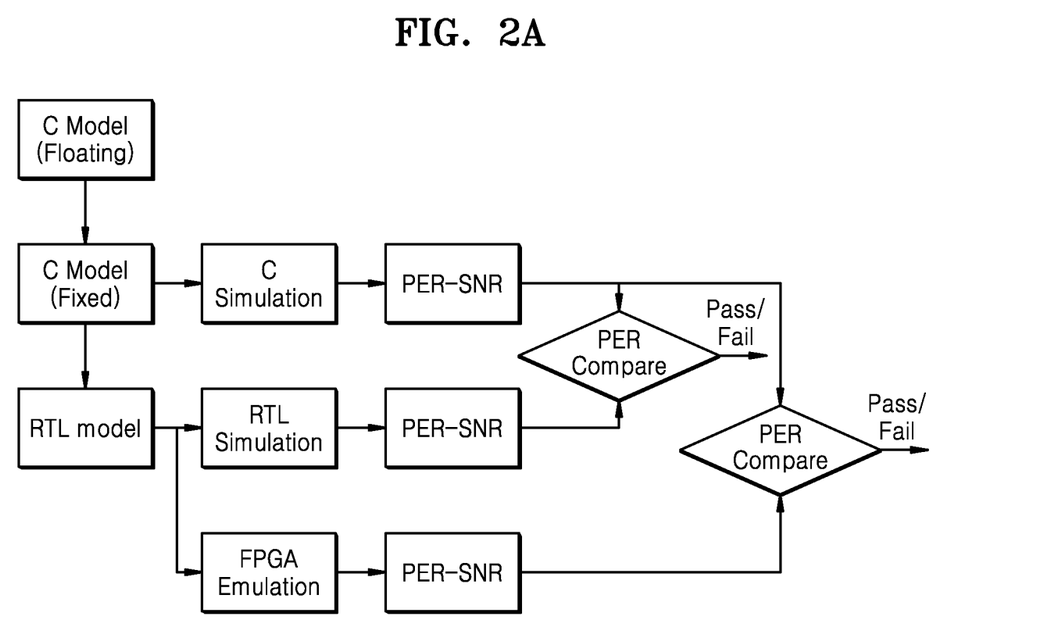
FIG. 2A is a flowchart of a process of designing and verifying a physical layer (PHY) of a wireless local area network (WLAN), according to a comparative example.
Figure 2B:
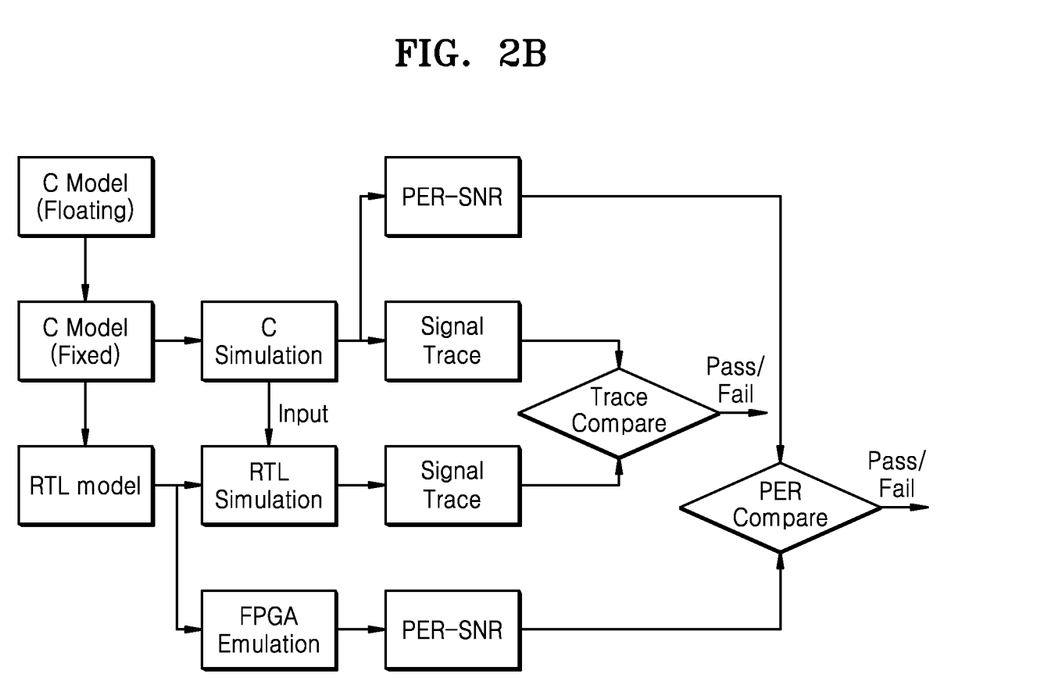
FIG. 2B is a flowchart of a process of designing and verifying a PHY layer of a WLAN, according to an embodiment of the inventive concept.

FIG. 2A is a flowchart of a process of designing and verifying a PHY layer of a WLAN, according to a comparative example, and FIG. 2B is a flowchart of a process of designing and verifying a PHY layer of a WLAN, according to an embodiment of the inventive concept.

Institute of Electrical and Electronics Engineers (IEEE) 802.11 may be a technique used in a computer wireless network for a WLAN called Wi-Fi. IEEE 802.11 may refer to a standard technology developed by the $11^{th}$ working group of the IEEE LAN/MAN standards committee (IEEE 802). The IEEE 802.11 standard has been updated by increasing wireless throughput and a working distance and stipulating the use of new frequencies, and includes specifications for a media access control (MAC) layer including a transmitter and a receiver and a PHY layer. Throughout the specification, a receiver of a PHY layer according to the IEEE 802.11 standard may be referred to as a PHY receiver or a receiving physical layer.

FIGS. 2A and 2B illustrate a method of developing and verifying a receiver of a PHY layer of a WLAN. According to a comparative example, an algorithm may be developed by using a floating-point C model, and a fixed-point C model suitable for hardware implementation may be developed from the algorithm. In this case, because RTL simulation using an RTL model takes about 100 times more time than C simulation, the RTL model may be developed in accordance with the C model after the algorithm is verified in the C model. To ascertain whether the RTL model matches the fixed-point C model, packet error rates (PERs) may be compared by generating a graph (SNR-PER) of PER relative to signal-to-noise ratio (SNR). In other words, assuming that an X-axial domain corresponds to an SNR and a Y-axial domain corresponds to a PER, a change in PER from a signal with a low SNR to a signal with a high SNR may be depicted as a result graph. The above-described RTL scheme may correspond to a black-box approach or black-box testing, and correspond to a method of comparing PERs by calculating results relative to arbitrary inputs, e.g., by calculating PERs relative to SNRs. In the case of RTL development, due to the advantages of simulation speed and black-box testing, a matching result of a final output value between the C model and the RTL model may be used as a pass criterion for a hardware regression test.

Because the RTL simulation using the RTL model takes about 100 times more time than the C simulation, an emulation using a field programmable gate array (FPGA) may be used as a substitute for the RTL simulation. The FPGA may be a semiconductor device including a designable logic element and a programmable circuit. The FPGA may be a programmable chip that operates according to specifications designed using an RTL. When the RTL is synthesized and downloaded to the FPGA, the FPGA may operate based on the RTL model. The above-described method may correspond to a method by which PERs may be measured by performing simulation in an independent environment.

However, in an initial development stage of IC design, a debugging operation using the simulation using the RTL model, which has higher visibility and less turn-around time (TAT) than the emulation using the FPGA, may be an efficient verification method. Here, visibility may refer to an extent to which internal signals of the PHY receiver may be checked when simulation is performed. As an example, because the simulation using the RTL model is easier to check the internal signals of the PHY receiver than the emulation using the FPGA, the simulation using the RTL model has higher visibility.

Referring to FIG. 2B, when the simulation using the RTL model is performed, pass or fail may be determined by matching internal signals between the C model and the RTL model. Here, the internal signals of the PHY receiver may include a synchronization result, inputs and outputs of fast Fourier transform (FFT), channel, a phase error, equalized data, a log likelihood ratio (LLR), and decoded bits.

Because the RTL simulation has to use the same test packet as an input value to match the internal signals, a trace generated in the C simulation may be used as the input value. A trace may be a set of a series of vector lists of internal signals. The PHY receiver may output the same value from different pieces of input data transmitted through different types of channels from the transmitter configured to encode the same data. Accordingly, the same output value of the C model and the RTL model may not mean equivalence between the C model and the RTL model.

Unlike in FIG. 2A, referring to FIG. 2B, by inputting the same test packet to the C model and the RTL model, the C model may be coupled to the RTL model to perform the simulation. To ascertain whether the RTL model matches the fixed-point C model, internal signals of the RTL model may be compared with internal signals of the C model by tracing the internal signals of each of the RTL model and the C model (Signal Trace). The above-described scheme may correspond to a white-box approach or white-box testing and correspond to a method of comparing internal signals according to an arbitrary input value, by tracing (or Signal Trace). The method described above may detect early potential faults through matching of the internal signals as well as the decoded outputs between the C model and the RTL model, and may be used especially in an initial design stage.

In particular, in a late stage of the IC design of the PHY receiver, emulation using the FPGA may be performed as described with reference to FIG. 2A. Thus, the IC design may be verified by comparing PERs relative to SNRs by using a plurality of test packets.

In the RTL simulation of the PHY receiver, a trace file size and an RTL simulation time in the IC design verification method of FIG. 2A may be compared with a trace file size and an RTL simulation time in the IC design verification method of FIG. 2B.

As an example, assuming that a 2×2 multiple-input and multiple-output (MIMO) system uses a PHY receiver configured to support 80 MHz according to the IEEE 802.11 ac standard, test packets may be tested for each modulation and coding scheme (MCS). By executing the C model using black-box testing according to the method of FIG. 2A, input and output trace values of the RTL simulation of the PHY receiver may be derived and stored. By executing the C model using white-box testing according to the method of FIG. 2B, input and output values of the RTL simulation of the PHY receiver and trace values of internal signals may be derived and stored. An experimental example showed that white-box testing had at least about 13 times a trace file size of black-box testing and took at least 1.3 times an RTL simulation time of black-box testing. However, to ascertain whether the C model matches the RTL model by comparing the PER-SNR based on the black-box testing of FIG. 2A, many more test packets may be required as compared to the white-box testing. Accordingly, the method of FIG. 2B may be more suitable for the RTL simulation.

Figure 3:
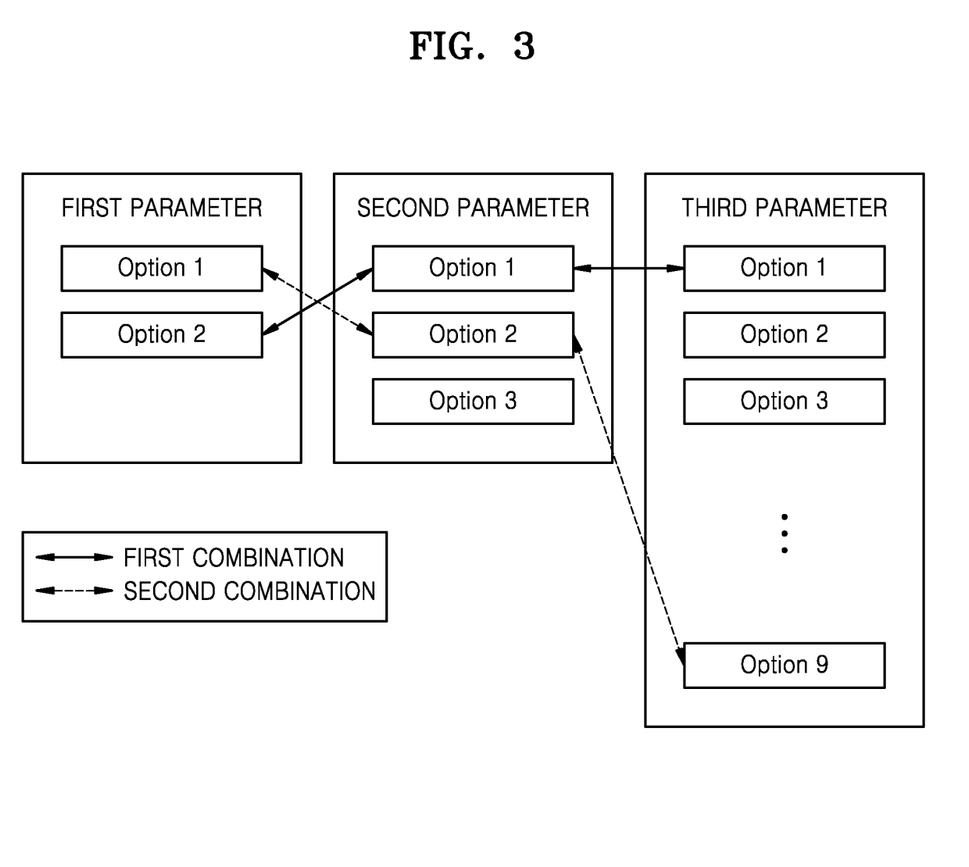
FIG. 3 illustrates a method of setting a cross-coverage model of high-level parameters, according to an embodiment of the inventive concept.
Figure 4A:
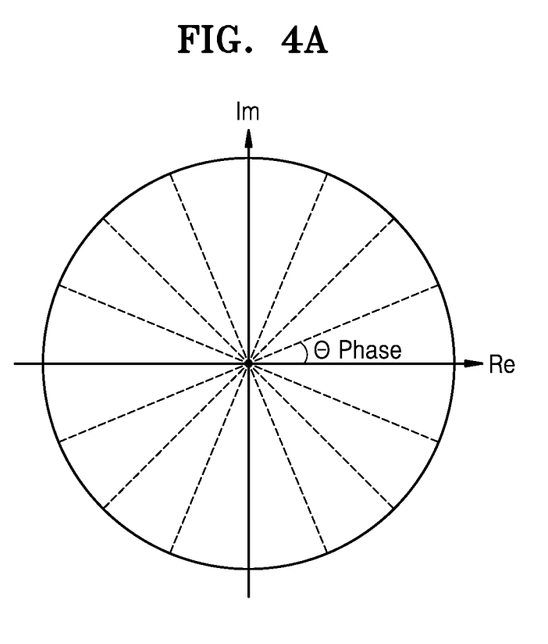
FIG. 4A illustrates a coverage model of equal parts for phase variables of low-level internal signals according to an embodiment of the inventive concept.

FIG. 3 illustrates a method of setting a cross-coverage model of high-level parameters, according to an embodiment of the inventive concept. FIG. 4A illustrates a coverage model of equal parts for phase variables of low-level internal signals according to an embodiment of the inventive concept, and FIG. 4B illustrates a coverage model of geometrically equal parts for data and channel variables of low-level internal signals according to an embodiment of the inventive concept.

Setting of a coverage model may be one of the important factors for evaluating and improving test packets. A coverage may include a plurality of attribute values of the coverage model, and may be used to verify design under tests (DUT) and indicate the quality of test cases. Because measuring the attribute values included in the coverage is impractical and takes a relatively long time, it may be important to select a meaningful combination of attribute values. Therefore, it may be important to select an appropriate attribute and coverage model according to characteristics of the DUT verification. In particular, in the case of a PHY receiver, because high-level parameters for determining characteristics of a packet are different from characteristics of low-level internal signals of the PHY receiver, it may be necessary to differently set the coverage model.

Figure 4B:
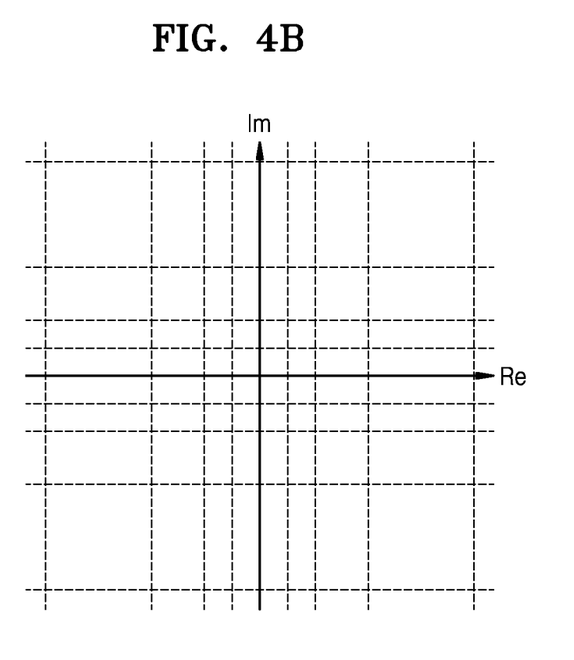
FIG. 4B illustrates a coverage model of geometrically equal parts for data and channel variables of low-level internal signals according to an embodiment of the inventive concept.

Referring to FIGS. 3 to 4B, the coverage model for the PHY receiver, according to an embodiment of the inventive concept, may adopt a cross-coverage model for the high-level parameters and a sub-sampled coverage model for the low-level internal signals. According to the coverage model for the PHY receiver, which adopts a combination test and a constrained random method, a test packet for a regression test, which has a short simulation time and a high coverage, may be generated. The number of test packets may be reduced in the case of a plurality of protocols due to backward compatibility.

The high-level parameters may be different depending on a protocol, and a corresponding function may be added so that a user may determine whether to turn on or off an arbitrary algorithm as needed. As an example, the high-level parameters may be different depending on whether the protocol is an IEEE 802.11 n protocol, an IEEE 802.11 ac protocol, or an IEEE 802.11 ax protocol. In addition, when signals are received, estimation or compensation may be performed using various algorithms to increase receiving performance, and a single parameter may be set to determine whether to use (or turn on or off) the algorithms.

As an example, in a PHY receiver that supports the IEEE 802.11 ac standard and uses one antenna, the high-level parameters may include an encoding scheme (binary convolutional coding (BCC)/low-density parity-check (LDPC)), MCS index (0 to 9), a bandwidth (BW) (20 MHz/40 MHz/80 MHz), a guard interval (0.4 μs and 0.8 μs), space-time block code (STBC), or the like. In addition, common phase error (CPE) and frequency error compensation, which are receiver algorithms, may be added to the high-level parameters.

According to an embodiment of the inventive concept, it may be important for the high-level parameters to cover the number of all cases to generate and determine a result value according to a relationship between the high-level parameters. For example, it may be necessary to ascertain whether all MCS indices are tested for each bandwidth. Accordingly, setting a coverage using a cross coverage may be an efficient method. In this case, an encoding matrix may be generated using options of all high-level parameters.

FIG. 3 illustrates an example of a method of setting a cross-coverage model of combination type 3, according to an embodiment of the inventive concept. The cross-coverage of the combination type 3 may refer to a cross-coverage model in which respective options of three parameters are combined. However, the inventive concept is not limited thereto, and a combination-type cross-coverage model including more parameters, e.g., a fourth parameter, may be set.

According to an embodiment of the inventive concept, a first parameter may be an encoding scheme. Types of encoding schemes may include BCC and LDPC. In this case, Option 1 may be BCC, and Option 2 may be LDPC.

As an example, a second parameter may be a bandwidth. As an example, the bandwidth may be 20 MHz, 40 MHz, or 80 MHz. In this case, Option 1 may correspond to 20 MHz, Option 2 may correspond to 40 MHz, and Option 3 may correspond to 80 MHz.

According to an embodiment of the inventive concept, a third parameter may be an MCS. As an example, the MCS may include MCS index 0 to MCS index 9. In this case, Option 1 to Option 10 may correspond to MCS indices 0 to 9, respectively.

As an example, a first combination of combination type 3 may be selected as the cross-coverage of the high-level parameters. In other words, test packets may be estimated according to a cross-coverage model corresponding to the case of a PHY receiver having a transmission rate corresponding to MCS 10 and configured to encode using a BCC scheme and support 40 MHz.

In an IEEE 802.11 PHY setting (configuration), cross-coverage models of combination type 2 (or a second combination) may be selected. In this case, an unnecessary cross-coverage model of combination type 2 may be removed, and a cross-coverage model of combination type 3 may be added. As an example, from among MCS indices 0 to 9 that support a bandwidth of 20 MHz, MCS 8 that corresponds to a non-existent or invalid combination and supports a bandwidth of 20 MHz may be the unnecessary cross-coverage model of combination type 2.

In the above-described method, it may be ascertained whether an operation of an IC to be verified is normal, for example, in all MCSs that support each bandwidth.

According to an embodiment of the inventive concept, FIG. 4A shows a coverage model using a technique of uniformly sub-sampling a phase of a low-level internal signal, and FIG. 4B shows a coverage model using a technique of geometrical sub-sampling data and channels, which are complex values of a low-level internal signal.

In the PHY receiver, it may be difficult to cover all internal signals with a limited number of test packets, and thus, it may be difficult to measure a coverage of all the internal signals. Therefore, a coverage metric for selected internal signals may be generated to determine whether the C model matches the RTL model.

Referring to FIG. 4A, to test a phase value of the internal signal in all areas, the phase value may be uniformly divided into 16 equal parts, and a sub-sampled coverage model may be applied to each range.

Referring to FIG. 4B, a coverage model that is not uniform and geometrically sub-sampled may be applied to data or a channel value of an internal signal having a complex value without using a coverage model for each of a real number (Re) and an imaginary number (Im).

Figure 5:
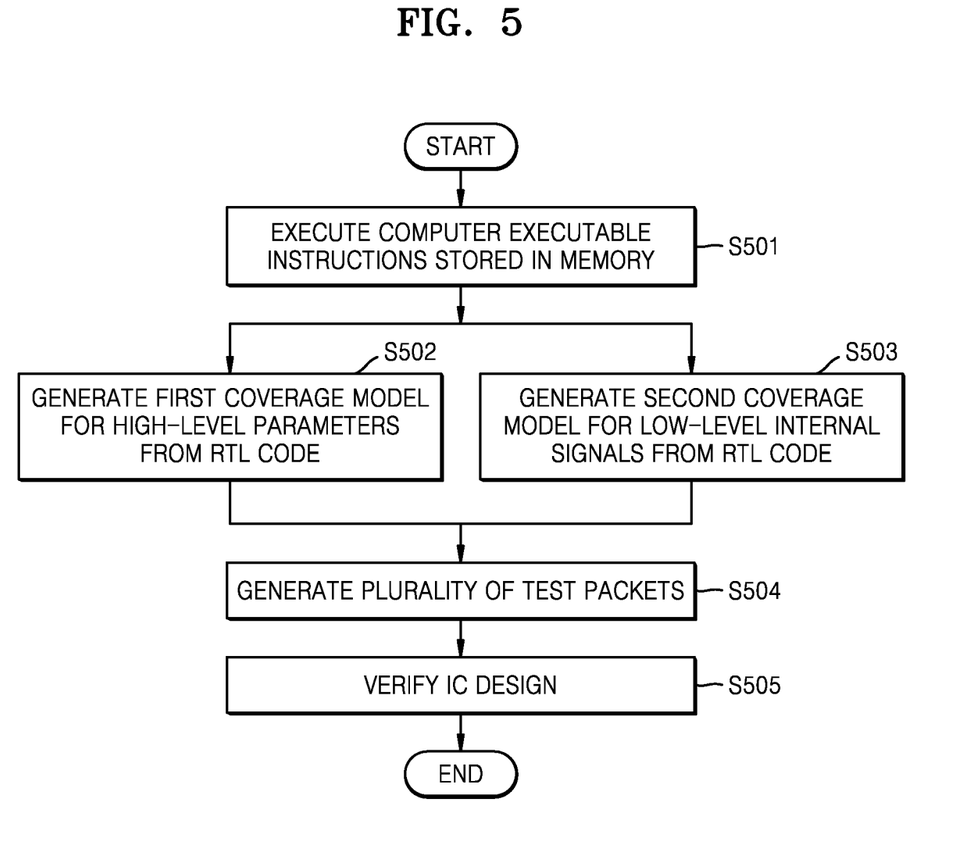
FIG. 5 is a flowchart of a method of operating a computing system according to FIGS. 3 to 4B, according to an embodiment of the inventive concept.

FIG. 5 is a flowchart of a method of operating a computing system according to FIGS. 3 to 4B, according to an embodiment of the inventive concept.

Referring to FIGS. 3 to 4B, a computing system according to an embodiment of the inventive concept may include a computer including a series of code and simulation tools configured to design and verify a PHY receiver defined in the IEEE 802.11 standard. Similar to FIG. 1, the computing system may include a memory and a processor. The memory of the computing system may store programs or computer executable instructions for processing and controlling the processor.

In operation S501, the process of the computing system may execute the computer executable instructions stored in the memory. In operation S502, as described above with reference to FIG. 3, a first coverage model for high-level parameters may be generated from RTL code written by a user. A detailed description of the first coverage model for the high-level parameters will be omitted.

In operation S503, as described above with reference to FIGS. 4A and 4B, a second coverage model for low-level internal signals may be generated from RTL code written by a user. A detail description of the second coverage model for the low-level internal signals will be omitted.

In operation S504, a plurality of test packets may be generated based on the first coverage model and the second coverage model. In operation S505, IC design for the PHY receiver may be verified using the plurality of test packets that are generated.

Figure 6A:
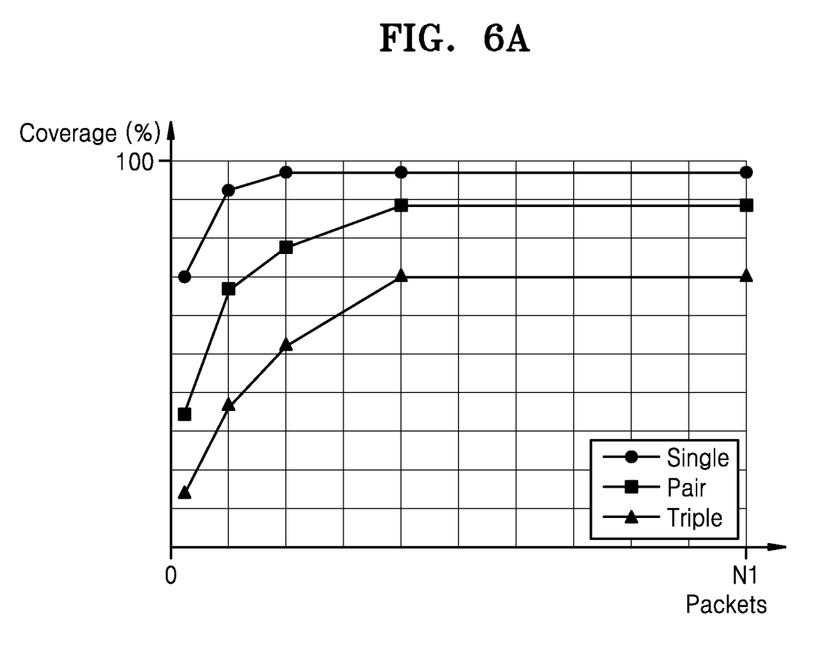
FIG. 6A is a graph of a cumulative average cross-coverage of the cross-coverage model of FIG. 3 according to an embodiment of the inventive concept.
Figure 6B:
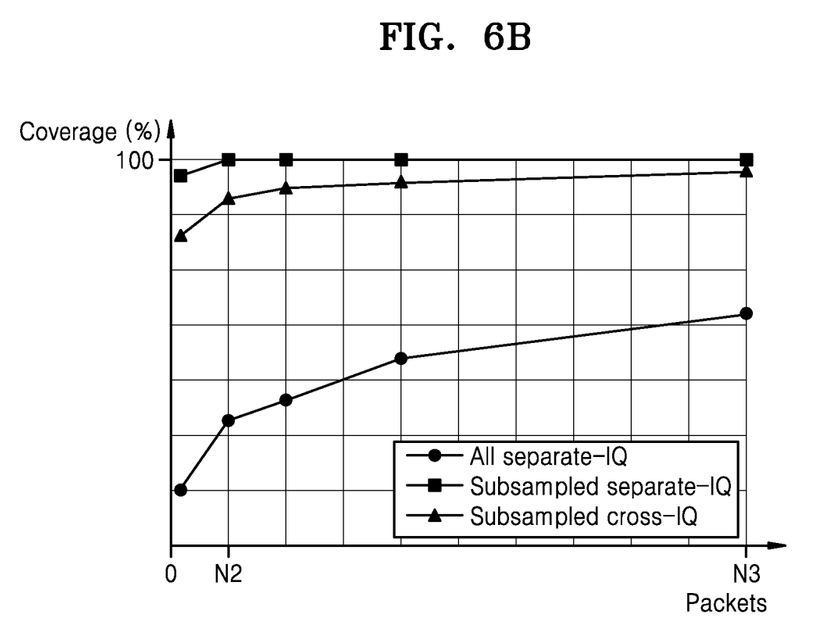
FIG. 6B is a graph of a cumulative average coverage of a cross-coverage model of FIGS. 4A and 4B according to an embodiment of the inventive concept.

FIG. 6A is a graph of a cumulative average cross-coverage of the cross-coverage model of FIG. 3 according to an embodiment of the inventive concept. FIG. 6B is a graph of a cumulative average coverage of a cross-coverage model of FIGS. 4A and 4B according to an embodiment of the inventive concept.

Assuming that a PHY receiver supports 80 MHz corresponding to the IEEE 802.11 ac standard, FIG. 6A is a graph showing results of comparing cross-coverage models using coverage algorithms of combination types 1 to 3 (or 1-way to 3-way coverage algorithms) when a plurality of parameters are selected to evaluate a coverage model for a high-level parameter. For example, the plurality of parameters may include a bandwidth, a channel offset, the number of transmitting antennas, a frequency offset, a channel model, or an encoding scheme. Among them, parameters (e.g., an SNR and a frequency offset) that do not have discrete values as options may use a sub-sampled coverage model.

Referring to FIG. 6A, N1 test packets may be generated using a constrained random method. When the number of generated test packets is N1, a saturated coverage (%) may be lower in the case of combination type pair (2) or triple (3) than in the case of combination type single (1). This is due to the fact that in the case of combination type 1, a coverage hole that is not included in a coverage model of combination type 2 or 3 cannot be detected. The coverage hole may refer to an area that may not be covered by the corresponding coverage model. As an example, in the case of combination type 1, because there is no cross-coverage point of an MCS and a bandwidth, it may be impossible to ascertain whether all MCS indices are covered at each bandwidth. Accordingly, a method of basically selecting a coverage model of at least combination type 2 and removing unnecessary coverage points may be suitable for the PHY receiver.

Assuming that the PHY receiver supports 80 MHz corresponding to the IEEE 802.11 ac standard, FIG. 6B is a graph showing results of comparing coverage models selected depending on whether the coverage models are sub-sampled and whether the coverage models are cross-coverage models when complex signals for each subcarrier, such as FFT outputs, channels, or equalized data, are selected to evaluate coverage models for low-level signals of the PHY receiver.

FIG. 6B shows a result of comparison of cumulative average coverages (%) relative to the number of test packets generated using a constrained random method according to a coverage model.

The coverage model without subsampling (or all separate-IQ model) may be a coverage model to which a real value and an imaginary value are individually applied, and may include many cover points because of high bit precision. A sub-sampled coverage model (or a sub-sampled separate-IQ model) may refer to a coverage model configured to measure a coverage using a geometric sub-sampling type of each of a real number part and an imaginary number part. As described above with reference to FIG. 4B, the sub-sampled cross-coverage model (or the sub-sampled cross-IQ model) may refer to a coverage model to which a cross-coverage of a real number part and an imaginary number part is applied.

As an example, referring to FIG. 6B, when the sub-sampled coverage model (or the sub-sampled separate-IQ model) is applied and the number of test packets is N2, a coverage may be saturated to 100%. Conversely, in a sub-sampled cross-coverage model (or a sub-sampled cross-IQ model), a coverage may not be saturated within N3 test packets. In other words, the sub-sampled coverage model (or the sub-sampled separate-IQ model) may not detect a coverage hole, which is not covered by the sub-sampled cross-coverage model (or the sub-sampled cross-IQ model). Accordingly, it may be a suitable method for the PHY receiver to basically use the sub-sampled cross-coverage model (or the sub-sampled cross-IQ model) for complex signals.

Figure 7:
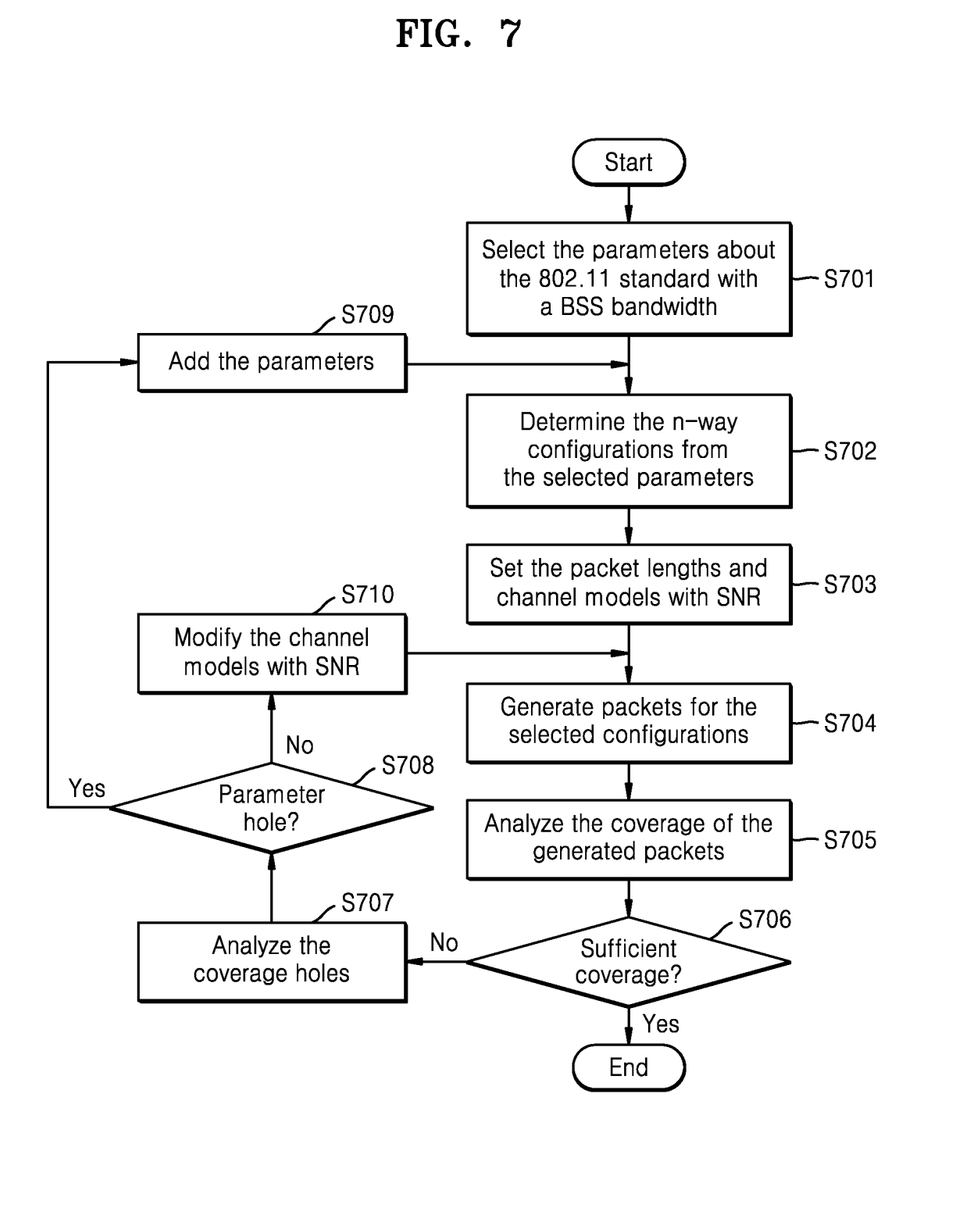
FIG. 7 is a flowchart of a method of generating a test packet according to an embodiment of the inventive concept.

FIG. 7 is a flowchart of a method of generating a test packet, according to an embodiment of the inventive concept.

FIG. 7 illustrates a method of generating a test packet to be applied to a PHY receiver.

In operation S701, parameters for the IEEE 802.11 standard in a basic service set (BSS) may be selected at a designed bandwidth. The BSS may be a basic network configuration unit defined by the IEEE 802.11 standard. The BSS may be an LAN environment including basic wireless devices in a limited space in which wireless service is possible.

In this case, by supporting backward compatibility, it may be determined whether to select a type of protocol as one of the parameters or select parameters for each protocol. As an example, when it is determined that the parameters are selected for each protocol, parameters may be individually selected in each of IEE 802.11 n, IEEE 802.11 ac, and IEEE 802.11 ax protocols. As another example, when it is determined that the type of protocol is selected as one of the parameters, the number of test packets for overlapping parameters in the IEE 802.11 n, IEEE 802.11 ac, and IEE 802.11 ax protocols may be reduced.

In operation S702, a parameter set constituting a configuration may be generated from the selected parameters using an N-way covering algorithm. As an example, when N equals 3, as described above with reference to FIG. 3, a cross-coverage model of combination type 3, in which respective options of three parameters are combined, may be set. In general, N may be selected from 3 or 4, and N may be determined according to the number of test packets generated and updated by a measured coverage. The N-way covering algorithm may be efficient to cover many cover points of the selected parameter by using a small number of test packets. In addition, when a plurality of protocols are supported by supporting backward compatibility, a similar coverage may be obtained using a smaller number of test packets than when test packets are generated for each protocol.

In operation S703, a length of the test packet may be determined according to each setting (configuration) considering the purpose of the test packet, and a channel model for an arbitrary SNR may also be determined according to each setting (configuration). As an example, the channel model may be a channel model considering additive white Gaussian noise (AWGN) or a fading channel model.

A length of the test packet may determine a simulation time of a regression test. As an example, when the allocation of a resource unit (RU) with a small size is tested in an IEEE 802.11 ax multi-user packet, the allocation of the RU may be tested using a combination of an RU map and user position by a couple of data symbols, and thus, a test packet with a small length may be used.

A channel model for an arbitrary SNR may determine a range of internal signals, and determine whether a decoding result passes or fails. Accordingly, as an example, in an initial development stage of IC design, the pass or fail of a decoding result and a basic decoding operation of the PHY receiver may be checked by using an AWGN channel model with a high SNR.

For diversity, unselected parameters may be generated by a constrained random method, and a configuration set may be determined.

In operation S704, after the configuration set is determined, a test packet for each configuration may be generated using a C model of a PHY transmitter. A field value of a signal symbol may be determined by a configuration, and a field value of a data symbol may be encoded by data that is randomly generated. The generated test packet may be decoded using a C model of the PHY receiver to generate traces of signals.

In operation S705, a coverage may be analyzed using a coverage model in which a trace is set. In operation S706, it may be determined whether a target coverage has been satisfied. When it is determined that the target coverage has not been satisfied (S706: No), a coverage hole may be detected or analyzed in operation S707.

In operation S708, as a result of analyzing the coverage hole, it may be determined whether a parameter hole is present. In operation S709, when it is determined that the parameter hole is present (S708: Yes), e.g., when a configuration is insufficient, a test packet may be additionally generated by adding a parameter. Subsequent to operation S709, operation S702 may be performed. In operation S710, when it is determined that the parameter hole is not present (S708: No), e.g., when a coverage of internal signals is insufficient, test packets may be regenerated by modifying an SNR and a channel model. Subsequent to operation S710, operation S704 may be performed.

Figure 8:
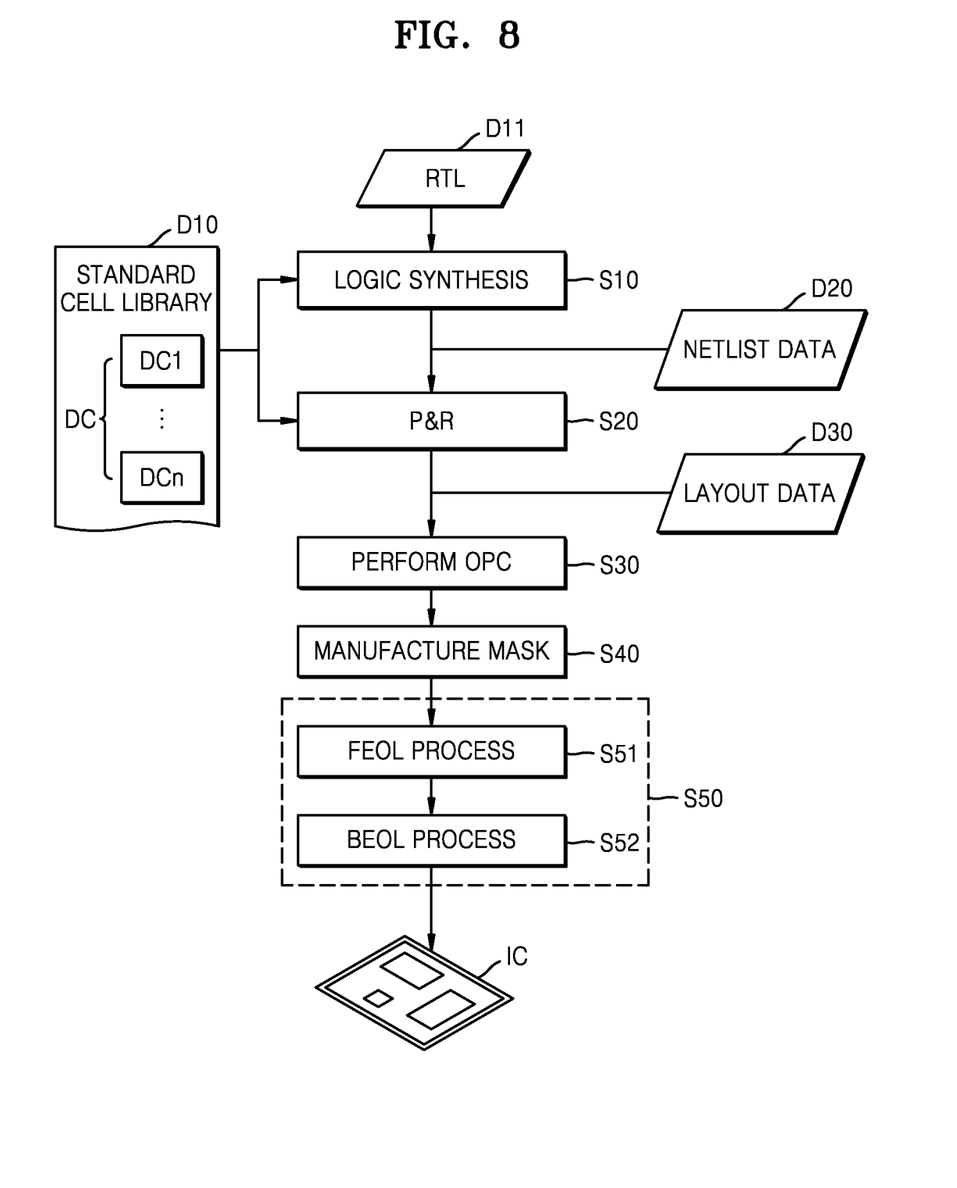
FIG. 8 is a flowchart of a method of fabricating an integrated circuit (IC) according to an embodiment of the inventive concept.

FIG. 8 is a flowchart of a method of fabricating an IC according to an embodiment of the inventive concept.

Referring to FIG. 8, a standard cell library D10 may include information (e.g., function information, characteristic information, and layout information) about standard cells. The standard cell library D10 may include data DC for defining layouts of the standard cells. The data DC may include data, which performs the same function and defines structures of standard cells with different layouts. The data DC may include first data DC1, which performs a first function and defines structures of standard cells with different layouts, and n-th data DCn (where n is a natural number greater than or equal to 2), which performs an n-th function and defines structures of standard cells with different layouts.

In operation S10, a logic synthesis operation of generating netlist data D20 from RTL data D11 may be performed. For example, a semiconductor design tool (e.g., a logic synthesis module) may perform a logic synthesis operation on the RTL data described by HDL (e.g., VHDL or Verilog) with reference to the standard cell library D10, and generate the netlist data D20 including a bitstream or a netlist. As described above with reference to FIGS. 1 to 6, according to a method of verifying design and a computing system according to embodiments of the inventive concept, RTL design may be developed, and the RTL data D11 may be generated.

As described above, the standard cell library D10 may include the data DC for defining structures of standard cells, which perform the same function and have different layouts, and the standard cells may be included in the IC with reference to the data DC during the logic synthesis operation.

In operation S20, a place & routing (P&R) operation may be performed to generate layout data D30 from the netlist data D20. The layout data D30 may have a format (e.g., GDSII) and include geometric information about standard cells and interconnections.

For example, a semiconductor design tool (e.g., a P&R module) may place a plurality of standard cells from the netlist data D20 with reference to the standard cell library D10. The semiconductor design tool may select one of the layouts of standard cells defined by a netlist with reference to the data DC, and place the selected layout of the standard cell.

In operation S20, an operation of generating interconnections may be further performed. The interconnections may electrically connect output pins to input pins of the standard cells and include, for example, at least one via and at least one conductive pattern.

In operation S30, optical proximity correction (OPC) may be performed. The OPC may refer to an operation for forming a pattern having a desired shape by correcting distortion (e.g., refraction) caused by the characteristics of light during a photolithography process included in a semiconductor process of fabricating an IC. A pattern on a mask may be determined by applying the OPC to the layout data D30. In embodiments of the inventive concept, a layout of the IC may be limitedly modified in operation S30, and the limited modification of the IC in operation S30 may be a post-processing operation for optimizing a structure of the IC and may be referred to as a design polishing operation.

In operation S40, an operation of manufacturing a mask may be performed. For example, by applying the OPC to the layout data D30, patterns on the mask may be defined to form patterns in a plurality of layers, and at least one mask (or photomask) configured to form respective patterns of the plurality of layers may be manufactured.

In operation S50, an operation of fabricating an IC may be performed. For example, the plurality of layers may be patterned using at least one mask manufactured in operation S40, thereby fabricating the IC. Operation S50 may include operations S51 and S52.

In operation S51, a front-end-of-line (FEOL) process may be performed. The FEOL process may refer to a process of forming individual elements (e.g., transistors, capacitors, and resistors) on a substrate during the fabrication of the IC. For example, the FEOL process may include planarizing and cleaning a wafer, forming a trench, forming a well, forming a gate line, and forming a source and a drain.

In operation S52, a back-end-of-line (BEOL) process may be performed. The BEOL process may refer to a process of interconnecting individual elements (e.g., transistors, capacitors, and resistors) during the fabrication of an IC. For example, the BEOL process may include siliciding a gate region, a source region, and a drain region, adding a dielectric material, performing a planarization process, forming a hole, forming a metal layer, forming a via, and forming a passivation layer. Next, the IC may be packaged in a semiconductor package and used as a component for various applications.

While the inventive concept has been particularly shown and described with reference to embodiments thereof, it will be understood by those of ordinary skill in the art that various changes in form and details may be made thereto without departing from the spirit and scope of the inventive concept as set forth by the following claims.

What is claimed is:

1. A computing system configured to verify design of an integrated circuit, the computing system comprising:
    a memory configured to store computer executable instructions; and
    a processor configured to generate a first coverage model for at least two high-level parameters from the Institute of Electrical and Electronics Engineers (IEEE) 802.11 standard or hardware description language code by executing the computer executable instructions, generate a second coverage model for low-level internal signals from the hardware description language code by executing the computer executable instructions, and generate a plurality of test packets for a regression test by using at least one of the first coverage model or the second coverage model by executing the computer executable instructions.

2. The computing system of claim 1, wherein the design of the integrated circuit comprises design of a receiver of a physical layer of a wireless local area network.

3. The computing system of claim 2, wherein the first coverage model comprises a cross-coverage model in which the at least two high-level parameters are combined.

4. The computing system of claim 2, wherein the at least two high-level parameters constitute a configuration of the physical layer of the wireless local area network, and
    one of the at least two parameters comprises one of an encoding scheme, a modulation and coding scheme, a bandwidth, or a guard interval.

5. The computing system of claim 2, wherein the second coverage model comprises a coverage model in which the low-level internal signals are sub-sampled.

6. The computing system of claim 5, wherein the second coverage model uniformly sub-samples phase values of the low-level internal signals and geometrically sub-samples data or channel values of the low-level internal signals.

7. The computing system of claim 1, wherein the processor is further configured to verify the design of the integrated circuit by using the plurality of test packets.

8. A computing system configured to verify design of a receiver of a physical layer according to the Institute of Electrical and Electronics Engineers (IEEE) 802.11 standard, the computing system comprising:
- a memory configured to store computer executable instructions; and
- a processor configured to generate a first coverage model for at least two high-level parameters from hardware description language code by executing the computer executable instructions, generate a second coverage model for low-level internal signals from the hardware description language code by executing the computer executable instructions, generate a plurality of test packets for a regression test by using at least one of the first coverage model or the second coverage model by executing the computer executable instructions, and verify the design of the receiver of the physical layer according to the plurality of test packets by executing the computer executable instructions.

9. The computing system of claim 8, wherein the first coverage model comprises a cross-coverage model in which the at least two high-level parameters are combined.

10. The computing system of claim 8, wherein the second coverage model comprises a sub-sampled coverage model for the low-level internal signals.

* * * * *